United States Patent
Breuer et al.

(10) Patent No.: US 9,660,436 B2
(45) Date of Patent: May 23, 2017

(54) DETECTION OF INTERCONNECTED OUTPUTS

(71) Applicant: OSRAM SYLVANIA Inc., Danvers, MA (US)

(72) Inventors: Christian Breuer, Newburyport, MA (US); Keng Chen, Sudbury, MA (US)

(73) Assignee: OSRAM SYLVANIA Inc., Wilmington, MA (US)

(*) Notice: Subject to any disclaimer, the term of this patent is extended or adjusted under 35 U.S.C. 154(b) by 470 days.

(21) Appl. No.: 14/377,504

(22) PCT Filed: Jul. 1, 2013

(86) PCT No.: PCT/US2013/048990
§ 371 (c)(1),
(2) Date: Aug. 7, 2014

(87) PCT Pub. No.: WO2014/005160
PCT Pub. Date: Jan. 3, 2014

(65) Prior Publication Data
US 2015/0180220 A1 Jun. 25, 2015

Related U.S. Application Data

(60) Provisional application No. 61/666,484, filed on Jun. 29, 2012.

(51) Int. Cl.
*H02H 3/20* (2006.01)
*G01R 21/00* (2006.01)
(Continued)

(52) U.S. Cl.
CPC ........... *H02H 3/20* (2013.01); *G01R 21/00* (2013.01); *G01R 31/2853* (2013.01);
(Continued)

(58) Field of Classification Search
CPC ...... H02H 3/20; G01R 21/00; G01R 31/2853; G01R 31/40; H05B 37/0209; H05B 41/2851; Y10T 307/438
See application file for complete search history.

(56) References Cited

U.S. PATENT DOCUMENTS 4,447,841 A  5/1984 Kent
7,996,162 B1 8/2011 Zhang et al.
(Continued)

FOREIGN PATENT DOCUMENTS

EP   1 858 304 A2   11/2007

OTHER PUBLICATIONS

Joao Carlos Silva, International Search Report for PCT/US2013/048990, Oct. 16, 2013, p. 1-3, European Patent Office, Rijswijk, The Netherlands.

*Primary Examiner* — Jared Fureman
*Assistant Examiner* — Rafael Pacheco
(74) *Attorney, Agent, or Firm* — Shaun P. Montana

(57) ABSTRACT

Systems and methods for detection of interconnected outputs of a power supply are provided. A first channel of a power supply is activated, such that power is supplied to a first load connected to the first channel. A first load voltage is measured for the first load. A second load voltage is measured for a second load connected to a second channel of the power supply. The second load voltage is compared to the first load voltage to generate an interconnection result. The power supply is shut down when the interconnection result indicates that the second load voltage matches the first load voltage, such that all channels of the power supply do not supply power to any load connected thereto.

17 Claims, 10 Drawing Sheets

(51) Int. Cl.
   *H05B 41/285*      (2006.01)
   *G01R 31/28*       (2006.01)
   *H05B 37/02*       (2006.01)
   *G01R 31/40*       (2014.01)

(52) U.S. Cl.
   CPC ..... *H05B 37/0209* (2013.01); *H05B 41/2851* (2013.01); *G01R 31/40* (2013.01); *Y10T 307/438* (2015.04)

(56) References Cited

U.S. PATENT DOCUMENTS 9,061,592 B2 *    6/2015   Meng .................... B60K 37/06
   2010/0072920 A1 * 3/2010   Chen ........................ H02J 1/08
                                                              315/297

* cited by examiner

DETECTION OF INTERCONNECTED OUTPUTS

CROSS-REFERENCE TO RELATED APPLICATIONS

The present application is a National Stage application of, and claims priority to, International Application No. PCT/US2013/048990, filed Jul. 1, 2013 and entitled "DETECTION OF INTERCONNECTED OUTPUTS", which claims priority of U.S. Provisional Patent Application No. 61/666,484, filed Jun. 29, 2012 and entitled "DETECTION OF INTERCONNECTED OUTPUTS", the entire contents of both of which are hereby incorporated by reference.

TECHNICAL FIELD

The present invention relates to lighting, and more specifically, to power supplies for lighting.

BACKGROUND

Underwriters Laboratories (UL) of Northbrook, Ill. defines certain standards for a Class 2 lighting power supply. Among these requirements are UL standards 1310 and 8750. These standards require that, in a power supply with multiple outputs channels, no single channel outputs more than 100 W of power.

SUMMARY

Errors without a power supply, such as but not limited to short circuits, open circuits, and the like, sometimes result in two or more output channels of a multichannel power supply becoming interconnected. In some power supplies, this may result in a situation where the output channels output more than 100 W of power, in violation of UL standards. Conventional techniques for avoiding violation of UL standards typically include using non-Class 2 power supplies in combination, using multiple power Class 2 power supplies instead of a single Class 2 power supply, and/or including isolation features within the Class 2 power supply. All of these alternatives are more costly than using a single Class 2 power supply. Thus, there is a need for a single, low cost power supply that is listed as a UL Class 2 power supply and does not violate the UL standards.

Embodiments of the present invention provide a power supply, particularly a UL Class 2 power supply, which detects when its outputs are interconnected and thus would violate the 100 W maximum output UL standards. Upon detecting such interconnected outputs, the power supply shuts down. In some embodiments, the power supply performs this detection during start up. In some embodiments, the power supply performs this detection during operation. Embodiments allow for detection of interconnected outputs whether or not the power to the load(s) connected to the power supply is dimmed.

In an embodiment, there is provided a method. The method includes: activating a first channel of a power supply, such that power is supplied to a first load connected to the first channel; measuring a first load voltage for the first load; measuring a second load voltage for a second load connected to a second channel of the power supply; comparing the second load voltage to the first load voltage to generate an interconnection result; and shutting down the power supply when the interconnection result indicates that the second load voltage matches the first load voltage, such that all channels of the power supply do not supply power to any load connected thereto.

In a related embodiment, the method may further include: prior to activating the first channel: measuring a first baseline voltage for the first load; measuring a second baseline voltage for the second load; and after activating the first channel: wherein comparing comprises: comparing the second load voltage to the second baseline voltage to generate a baseline interconnection result; and wherein shutting down comprises: shutting down the power supply when the baseline interconnection result indicates that the second load voltage is different from the second baseline voltage, such that all channels of the power supply do not supply power to any load connected thereto. In a further related embodiment, comparing may further include: comparing the second load voltage to the first load voltage to generate an interconnection result; and wherein shutting down the power supply may include: shutting down the power supply when the interconnection result indicates that the second load voltage matches the first load voltage and when the baseline interconnection result indicates that the second load voltage is different from the second baseline voltage, such that all channels of the power supply do not supply power to any load connected thereto.

In another related embodiment, comparing may include: comparing the second load voltage to the first load voltage to generate a first interconnection result; de-activating the first channel; activating the second channel, such that power is supplied to the second load connected to the second channel; measuring the first load voltage for the first load; measuring the second load voltage for the second load; and comparing the second load voltage to the first load voltage to generate a second interconnection result; and shutting down may include: shutting down the power supply when the first interconnection result and the second interconnection result each indicate that the second load voltage matches the first load voltage, such that all channels of the power supply do not supply power to any load connected thereto.

In still another related embodiment, measuring a second load voltage may include: measuring a second load voltage for a second load connected to a second channel of the power supply; and measuring a third load voltage for a third load connected to a third channel of the power supply; wherein comparing may include: comparing the second load voltage to the first load voltage to generate a first interconnection result; and comparing the third load voltage to the first load voltage to generate a second interconnection result; and wherein shutting down may include: shutting down the power supply when either the first interconnection result indicates that the second load voltage matches the first load voltage or the second interconnection results indicates that the third load voltage matches the first load voltage, such that all channels of the power supply do not supply power to any load connected thereto.

In yet another related embodiment, the method may further include: activating the second channel of the power supply, such that power is supplied to the second load connected to the second channel; monitoring the first load voltage and the second load voltage by measuring the first load voltage and the second load voltage over time; creating a plurality of interconnection results by comparing each monitored first load voltage with each monitored second load voltage; determining that an interconnection result in the plurality of interconnection results indicates that a monitored second load voltage matches a monitored first load voltage; de-activating one of the first channel and the second channel of the power supply; re-measuring the first load voltage and the second load voltage; comparing the re-measured second load voltage to the re-measured first load voltage to generate a verification interconnection result; and shutting down the power supply when the verification interconnection result indicates that the re-measured second load voltage matches the re-measured first load voltage, such that all channels of the power supply do not supply power to any load connected thereto.

In still yet another related embodiment, the method may further include: activating the second channel of the power supply, such that power is supplied to the second load connected to the second channel; monitoring the first load voltage and the second load voltage by measuring the first load voltage and the second load voltage over time; detecting a change in the monitored first load voltage or the monitored second load voltage; de-activating the first channel and the second channel of the power supply, such that no power is supplied to the first load or to the second load; re-activating either the first channel or the second channel; re-measuring the first load voltage for the first load and the second load voltage for the second load; comparing the re-measured second load voltage to the re-measured first load voltage to generate a change interconnection result; and shutting down the power supply when the change interconnection result indicates that the re-measured second load voltage matches the re-measured first load voltage, such that all channels of the power supply do not supply power to any load connected thereto.

In yet still another related embodiment, activating may include: activating a first channel and a second channel of a power supply, such that power is supplied to a first load connected to the first channel and to a second load connected to the second channel; and for a defined period of time, de-activating one of the first channel and the second channel; wherein measuring a first load voltage may include: during the defined period of time, measuring a first load voltage of the first load; wherein measuring a second load voltage may include: during the defined period of time, measuring a second load voltage of the second load; wherein comparing may include: during the defined period of time, comparing the load voltage of the load connected to the de-activated channel to a no load value to generate an interconnection result; and wherein shutting down may include: during the defined period of time, shutting down the power supply when the interconnection result indicates that the load voltage of the load connected to the de-activated channel does not match the no load value, such that all channels of the power supply do not supply power to any load connected thereto, else re-activating the de-activated channel.

In another embodiment, there is provided a power supply. The power supply includes: an input circuit configured to receive input power and to provide modified input power; and an output circuit configured to receive the modified input power and to output output power, wherein the output circuit includes: a first channel; a second channel; a processor; a memory; and an interconnection mechanism allowing communication between the processor, the memory, the first channel, and the second channel; wherein the first channel and the second channel provide the output power to one or more loads connected thereto; and wherein the memory is encoded with an interconnected output detection application, which, when executed in the processor as an interconnected output detection process, causes the output circuit to perform operations of: activating the first channel, such that power is supplied to a first load connected to the first channel; measuring a first load voltage for the first load; measuring a second load voltage for a second load connected to the second channel; comparing the second load voltage to the first load voltage to generate an interconnection result; and shutting down the power supply when the interconnection result indicates that the second load voltage matches the first load voltage, such that all channels of the power supply do not supply power to any load connected thereto.

In a related embodiment, the output circuit may perform further operations of: prior to activating the first channel: measuring a first baseline voltage for the first load; measuring a second baseline voltage for the second load; and after activating the first channel: wherein comparing may include: comparing the second load voltage to the second baseline voltage to generate a baseline interconnection result; and wherein shutting down may include: shutting down the power supply when the baseline interconnection result indicates that the second load voltage is different from the second baseline voltage, such that all channels of the power supply do not supply power to any load connected thereto.

In a further related embodiment, when comparing, the output circuit may perform further operations of: comparing the second load voltage to the first load voltage to generate an interconnection result; and wherein when shutting down the power supply, the output circuit may perform operations of: shutting down the power supply when the interconnection result indicates that the second load voltage matches the first load voltage and when the baseline interconnection result indicates that the second load voltage is different from the second baseline voltage, such that all channels of the power supply do not supply power to any load connected thereto.

In another related embodiment, when comparing, the output circuit may perform operations of: comparing the second load voltage to the first load voltage to generate a first interconnection result; de-activating the first channel; activating the second channel, such that power is supplied to the second load connected to the second channel; measuring the first load voltage for the first load; measuring the second load voltage for the second load; and comparing the second load voltage to the first load voltage to generate a second interconnection result; and wherein when shutting down, the output circuit may perform operations of: shutting down the power supply when the first interconnection result and the second interconnection result each indicate that the second load voltage matches the first load voltage, such that all channels of the power supply do not supply power to any load connected thereto.

In yet another related embodiment, when measuring a second load voltage, the output circuit may perform operations of: measuring a second load voltage for a second load connected to a second channel of the power supply; and measuring a third load voltage for a third load connected to a third channel of the power supply; wherein when comparing, the output circuit may perform operations of: comparing the second load voltage to the first load voltage to generate a first interconnection result; and comparing the third load voltage to the first load voltage to generate a second interconnection result; and wherein when shutting down, the output circuit may perform operations of: shutting down the power supply when either the first interconnection result indicates that the second load voltage matches the first load voltage or the second interconnection results indicates that the third load voltage matches the first load voltage, such that all channels of the power supply do not supply power to any load connected thereto.

In still another related embodiment, wherein the output circuit may perform further operations of: activating the second channel of the power supply, such that power is supplied to the second load connected to the second channel; monitoring the first load voltage and the second load voltage by measuring the first load voltage and the second load voltage over time; creating a plurality of interconnection results by comparing each monitored first load voltage with each monitored second load voltage; determining that an interconnection result in the plurality of interconnection results indicates that a monitored second load voltage matches a monitored first load voltage; de-activating one of the first channel and the second channel of the power supply; re-measuring the first load voltage and the second load voltage; comparing the re-measured second load voltage to the re-measured first load voltage to generate a verification interconnection result; and shutting down the power supply when the verification interconnection result indicates that the re-measured second load voltage matches the re-measured first load voltage, such that all channels of the power supply do not supply power to any load connected thereto.

In yet still another related embodiment, the output circuit may perform further operations of: activating the second channel of the power supply, such that power is supplied to the second load connected to the second channel; monitoring the first load voltage and the second load voltage by measuring the first load voltage and the second load voltage over time; detecting a change in the monitored first load voltage or the monitored second load voltage; de-activating the first channel and the second channel of the power supply, such that no power is supplied to the first load or to the second load; re-activating either the first channel or the second channel; re-measuring the first load voltage for the first load and the second load voltage for the second load; comparing the re-measured second load voltage to the re-measured first load voltage to generate a change interconnection result; and shutting down the power supply when the change interconnection result indicates that the re-measured second load voltage matches the re-measured first load voltage, such that all channels of the power supply do not supply power to any load connected thereto.

In still yet another related embodiment, when activating, the output circuit may perform operations of: activating a first channel and a second channel of a power supply, such that power is supplied to a first load connected to the first channel and to a second load connected to the second channel; and for a defined period of time, de-activating one of the first channel and the second channel; wherein when measuring a first load voltage, the output circuit may perform operations of: during the defined period of time, measuring a first load voltage of the first load; wherein when measuring a second load voltage, the output circuit may perform operations of: during the defined period of time, measuring a second load voltage of the second load; wherein when comparing, the output circuit may perform operations of: during the defined period of time, comparing the load voltage of the load connected to the de-activated channel to a no load value to generate an interconnection result; and wherein when shutting down, the output circuit may perform operations of: during the defined period of time, shutting down the power supply when the interconnection result indicates that the load voltage of the load connected to the de-activated channel does not match the no load value, such that all channels of the power supply do not supply power to any load connected thereto, else re-activating the de-activated channel.

In another embodiment, there is provided a computer program product, stored on a non-transitory computer readable medium, including instructions that, when executed on a processor in communication with a power supply, cause the processor to perform operations of: activating a first channel of a power supply, such that power is supplied to a first load connected to the first channel; measuring a first load voltage for the first load; measuring a second load voltage for a second load connected to a second channel of the power supply; comparing the second load voltage to the first load voltage to generate an interconnection result; and shutting down the power supply when the interconnection result indicates that the second load voltage matches the first load voltage, such that all channels of the power supply do not supply power to any load connected thereto.

BRIEF DESCRIPTION OF THE DRAWINGS

The foregoing and other objects, features and advantages disclosed herein will be apparent from the following description of particular embodiments disclosed herein, as illustrated in the accompanying drawings in which like reference characters refer to the same parts throughout the different views. The drawings are not necessarily to scale, emphasis instead being placed upon illustrating the principles disclosed herein.

DETAILED DESCRIPTION

Though embodiments are described throughout as relating to a UL Class 2 power supply for lighting, of course embodiments are not so limited and may be applied to any power supply having multiple output channels in which it is necessary to avoid the interconnection of any output channels.

Figure 1:
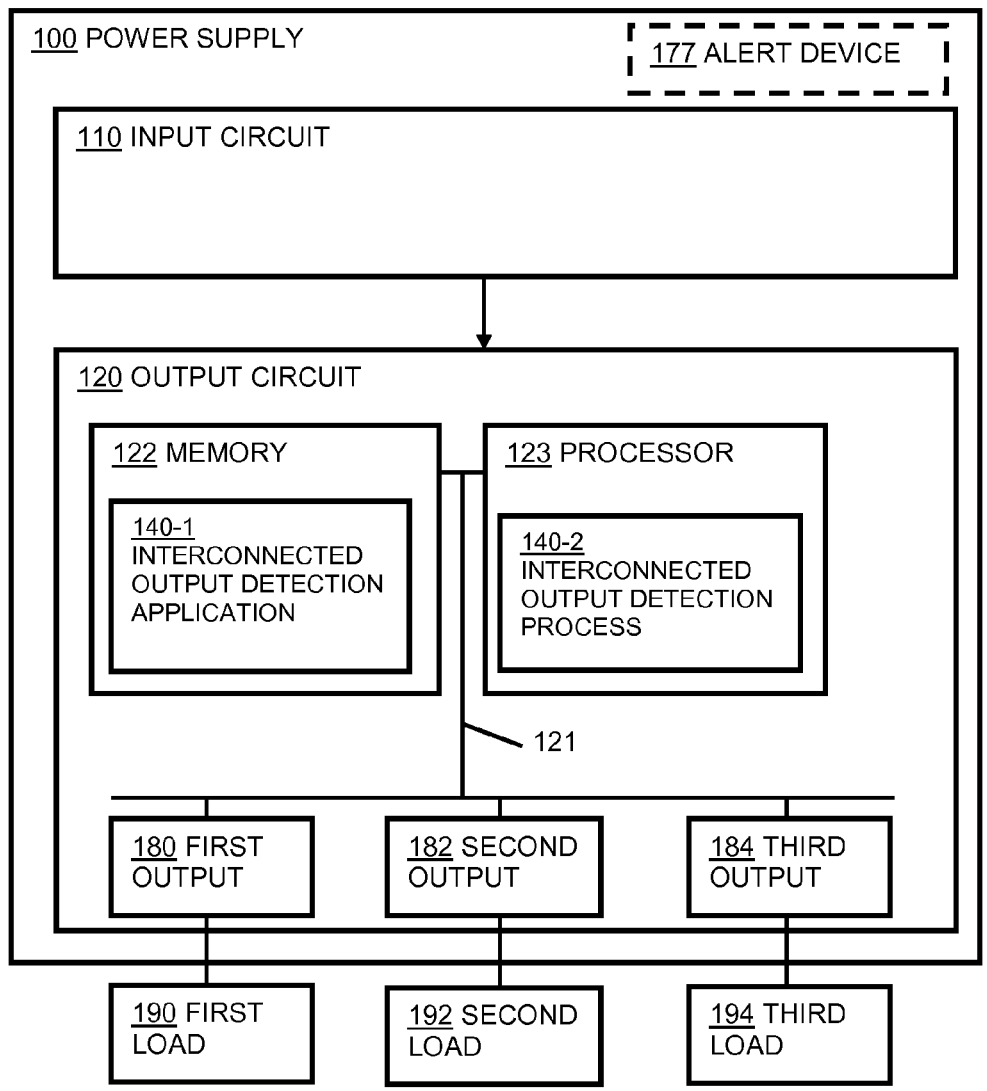
FIG. 1 shows a power supply capable of detecting whether any of its output channels are interconnected according to embodiments disclosed herein.

FIG. 1 is a block diagram illustrating example architecture of a power supply 100 that includes an input circuit 110 and an output circuit 120. As is well known in the art, the input circuit 110 is configured to receive input power (such as but not limited to AC power) and to provide modified input power (such as but not limited to DC power), and the output circuit 120 provides the modified input power as output power to one or more loads 190, 192, 194, via output channels 180, 182, 184. Though the output circuit 120 is shown in FIG. 1 as having a first output channel 180 (also referred to throughout as a first output 180 and/or a first channel 180), a second output channel 182 (also referred to throughout as a second output 182 and/or a second channel 182), and a third output channel 184 (also referred to throughout as a third output 184 and/or a third channel 184), embodiments of the output circuit 120 are not so limited. Thus, some embodiments of the output circuit 120 may and do include a plurality of output channels of any number. Further, though FIG. 1 shows the power supply 100 as having a distinct input circuit 110 and a distinct output circuit 120, embodiments are not so limited. Thus, in some embodiments, the functionality of the input circuit 110 and the output circuit 120 are combined into a single circuit, while in some embodiments, this functionality is distributed across more than two circuits. The one or more loads 190, 192, 194 (also referred to throughout as a first load 190, a second load 192, and a third load 194) may be and in some embodiments are any type of load capable of being connected to the power supply 100, and specifically include but are not limited to lighting-related loads, such as but not limited to solid state light sources (e.g., light emitting diodes (LEDs), organic light emitting diodes (OLEDs), polymer light emitting diodes (PLEDs), organic light emitting compounds (OLEC), and the like, including combinations thereof). To be capable of being connected to the power supply 100 (specifically, to one or more of the outputs 180, 182, 184 of the power supply 100), a load must be capable of receiving power, such that a voltage of any amount may be measured across the load, and/or such that a current of any amount may be measured running through the load.

The output circuit 120 executes, runs, interprets, operates or otherwise performs an interconnected output detection process 140-2 application 140-1 and an interconnected output detection process 140-2, suitable for use in explaining example configurations disclosed herein.

The output circuit 120 includes a first interconnection mechanism 121, such as but not limited to a data bus or other circuitry that couples a memory system 122 (also referred to herein as a memory 122), a processor 123, and the outputs 180, 182, 184. In some embodiments, an optional alert device 177 is coupled to the first interconnection mechanism 121 and activates to indicate to a user of the power supply 100 that one or more of the outputs 180, 182, 184 are interconnected. The memory system 122 is any type of computer readable medium and in some embodiments is encoded with an interconnected output detection process 140-2 application 140-1 that includes an interconnected output detection process 140-2. The interconnected output detection process 140-2 application 140-1 may be, and in some embodiments is, embodied as software code, such as but not limited to data and/or logic instructions (e.g., code stored in the memory system 122 or on another computer readable medium such as but not limited to a removable chip), and/or as firmware, that supports processing functionality according to different embodiments described herein. During operation of the power supply 100, the processor 123 accesses the memory 122 via the interconnection mechanism 121 in order to launch, run, execute, interpret or otherwise perform the logic instructions of the interconnected output detection process 140-2 application 140-1. Execution of the interconnected output detection process 140-2 application 140-1 in this manner produces processing functionality in an interconnected output detection process 140-2. In other words, the interconnected output detection process 140-2 represents one or more portions or runtime instances of the interconnected output detection process 140-2 application 140-1 performing or executing within or upon the processor 123 in the output circuit 120 at runtime.

It is noted that example configurations disclosed herein include the interconnected output detection process 140-2 application 140-1 itself including the interconnected output detection process 140-2 (i.e., in the form of un-executed or non-performing logic instructions and/or data). The interconnected output detection process 140-2 application 140-1 may be, and in some embodiments is, stored on a computer readable medium. The interconnected output detection process 140-2 application 140-1 may also be, and in some embodiments is, stored in the memory 122 such as in firmware, read only memory (ROM), or as executable code in, for example, Random Access Memory (RAM), among others. In addition to these embodiments, it should also be noted that other embodiments herein include the execution of the interconnected output detection process 140-2 application 140-1 in the processor 123 as the interconnected output detection process 140-2. Those skilled in the art will understand that the output circuit 120 and/or power supply 100 may, and in some embodiments do, include other processes and/or software and hardware components, such as an operating system not shown in this example.

Though embodiments are described throughout as having the output circuit 120 include the processor 123, the memory 122, and the interconnection mechanism 121, as well as the output 180, 182, 184, embodiments are not so limited. Thus, in some embodiments, one or more of these components may be and are found in the input circuit 110, and/or in some other circuit and/or circuits of the power supply 100. In such embodiments, the interconnection mechanism 121 extends across as many components of the power supply 100 as needed so as to interconnect the memory 122, the processor 123, and the outputs 180, 182, 184.

A number of flowcharts of the presently disclosed methods are illustrated in FIGS. 2-8. The rectangular elements are herein denoted "processing blocks" and represent computer software instructions or groups of instructions. Alternatively, the processing blocks represent steps performed by functionally equivalent circuits such as a digital signal processor circuit or an application specific integrated circuit (ASIC). The flowcharts do not depict the syntax of any particular programming language. Rather, the flowcharts illustrate the functional information one of ordinary skill in the art requires to fabricate circuits or to generate computer software to perform the processing required in accordance with the present invention. It should be noted that many routine program elements, such as initialization of loops and variables and the use of temporary variables are not shown. It will be appreciated by those of ordinary skill in the art that unless otherwise indicated herein, the particular sequence of steps described is illustrative only and may be varied without departing from the spirit of the invention. Thus, unless otherwise stated, the steps described below are unordered, meaning that, when possible, the steps may be performed in any convenient or desirable order. More specifically, FIGS. 2-8 illustrate various flowcharts of procedures performed by the power supply 100 of FIG. 1 when detecting whether any of its output channels 180, 182, 184 are interconnected.

Figure 2:
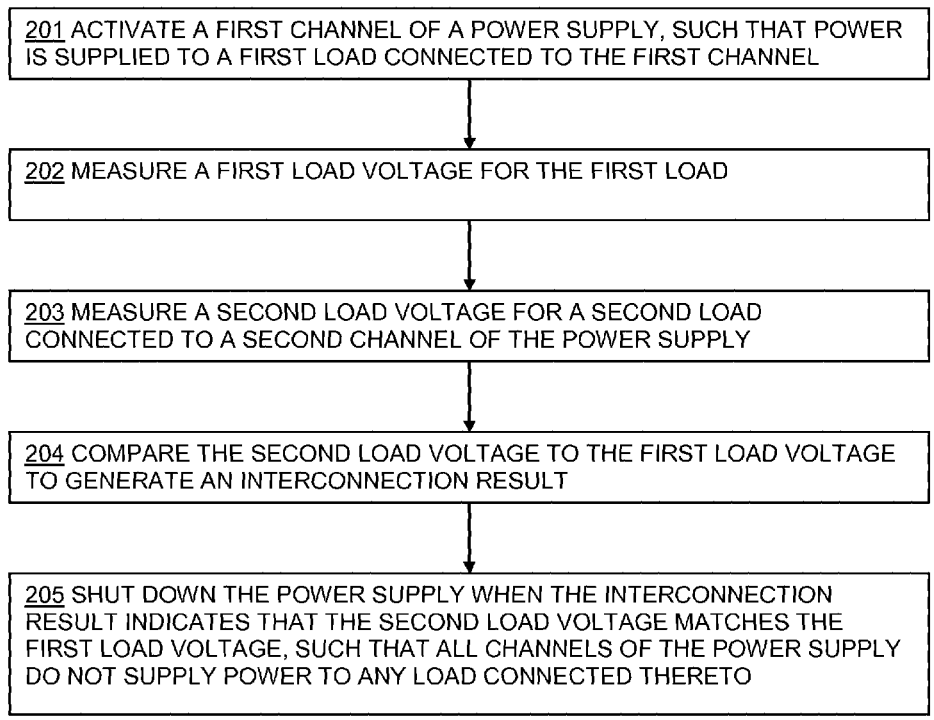
FIGS. 2-8 illustrate flowcharts of various operations performed by the power supply of FIG. 1 when detecting whether any of its output channel are interconnected.

FIG. 2 shows the interconnected output detection application 140-1 executed as the interconnected output detection process 140-2. The interconnected output detection process 140-2 activates a first channel of a power supply, step 201, such as but not limited to the first output 180 of the power supply 100 shown in FIG. 1, such that power is supplied to a first load connected to the first channel, such as but not limited to the first load 190 shown in FIG. 1. The interconnected output detection process 140-2 measures a first load voltage for the first load, step 202. A load voltage is the voltage across a load at the time the interconnected output detection process 140-2 takes this measurement. Thus, a first load voltage is a voltage across the first load, a second load voltage is a voltage across the second load, a third load voltage is a voltage across the third load, and so on. The interconnected output detection process 140-2 measures a second load voltage, step 203, for a second load connected to a second channel of the power supply, such as but not limited to the second load 192, the second channel 182, and the power supply 100 of FIG. 1. The interconnected output detection process 140-2 then compares the second load voltage to the first load voltage to generate an interconnection result, step 204. The interconnection result is the result of the comparison of the first load voltage and the second load voltage. If the first channel (i.e., the first output 180) is interconnected to the second channel (i.e., the second output 182), then the load voltage for the first load should be the same as the load voltage for the second load, because both the first load and the second load are receiving the same output, that is, the output power from the activated first channel. In some embodiments, the load voltage for the first load is substantially the same as the load voltage for the second load. Thus, the interconnection result, in situations where the first channel and the second channel are interconnected, should indicate that the first load voltage and the second load voltage match, i.e., are the same and/or substantially the same. In situations where the first channel and the second channel are not interconnected at the time of the measure of the load voltage for the first load and the load voltage for the second load, the interconnection result should indicate that the first load voltage and the second load voltage are do not match, i.e. are different and/or substantially different. The OID shuts down the power supply when the interconnection result indicates that the second load voltage matches the first load voltage, step 205, such that all channels of the power supply do not supply power to any load connected thereto. This allows the power supply to comply with the relevant UL standards for a Class 2 power supply.

Figure 3:
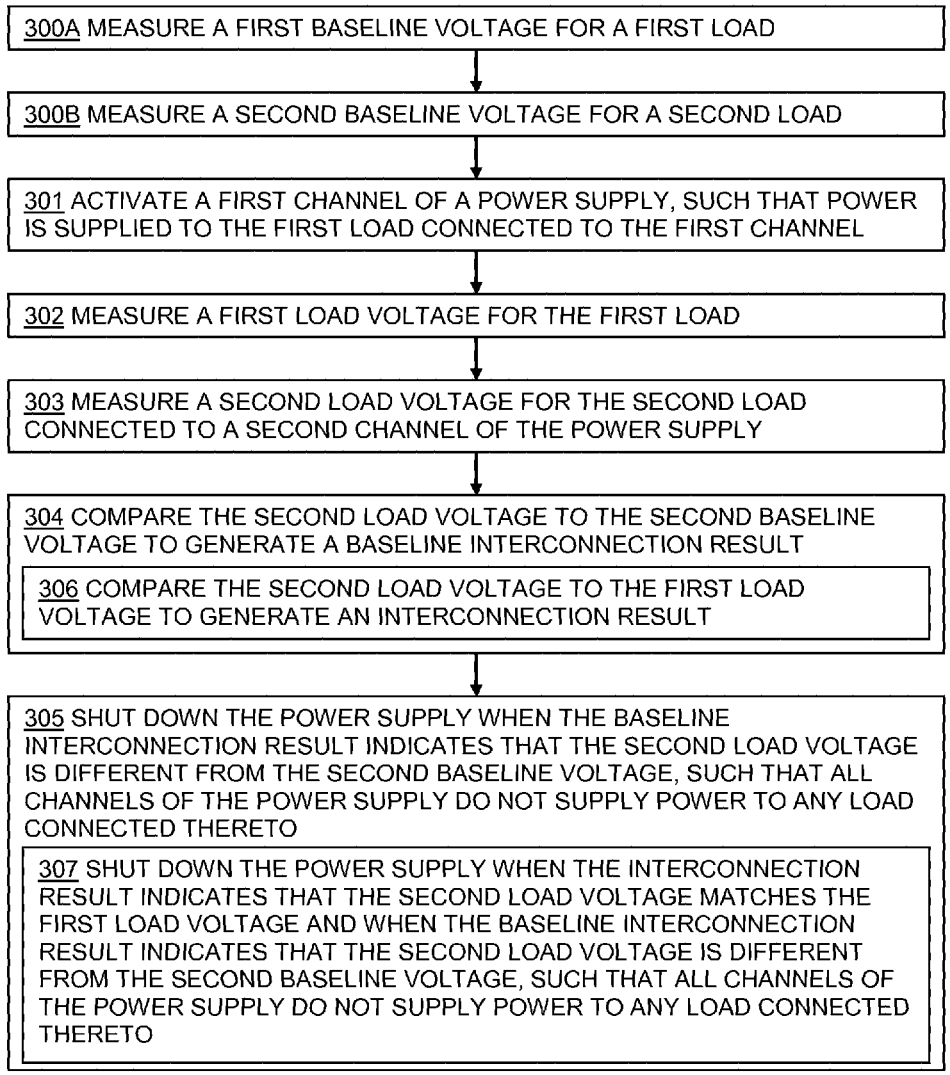

In some embodiments, such as shown in FIG. 3, the IOD takes a baseline measurement of the load voltages for each load connected to the power supply. The IOD then uses this baseline measurement, alone or in combination with the interconnection result, to determine whether or not any output channels of the power supply are interconnected, and if so, to shut down the power supply. The IOD, prior to activating the first channel, step 301, measures a first baseline voltage for the first load, step 300A, and measures a second baseline voltage for the second load, step 300B. The IOD then activates a first channel of the power supply, step 301, such that power is supplied to the first load connected to the first channel. The IOD measures a first load voltage for the first load, step 302, and measures a second load voltage for the second load, step 303. Thus, after activating the first channel, the IOD compares the second load voltage to the second baseline voltage to generate a baseline interconnection result, step 304. The baseline interconnection result indicates whether or not the second channel is connected to the first channel. Because the second channel has not yet been activated, the voltage across the second load should be the same as the baseline voltage for the second load. If the second load voltage is different from the second baseline voltage, then the second load is receiving power via the first channel, which has been activated, and thus the first channel and the second channel are interconnected. The IOD shuts down the power supply when the baseline interconnection result indicates that the second load voltage is different from the second baseline voltage, step 305, such that all channels of the power supply do not supply power to any load connected thereto. This allows the IOD to detect interconnected outputs in situations where the first load is different from the second load, and thus in which the first load voltage may be different from the second load voltage even though the first channel and the second channel are interconnected.

In some embodiments, the IOD uses both the baseline interconnection result and an interconnection result to determine whether the first and second outputs are interconnected. In such embodiments, the IOD also compares the second load voltage to the first load voltage to generate an interconnection result, step 306, and shuts down the power supply when the interconnection result indicates that the second load voltage matches the first load voltage and when the baseline interconnection result indicates that the second load voltage is different from the second baseline voltage, step 307, such that all channels of the power supply do not supply power to any load connected thereto.

Figure 4:
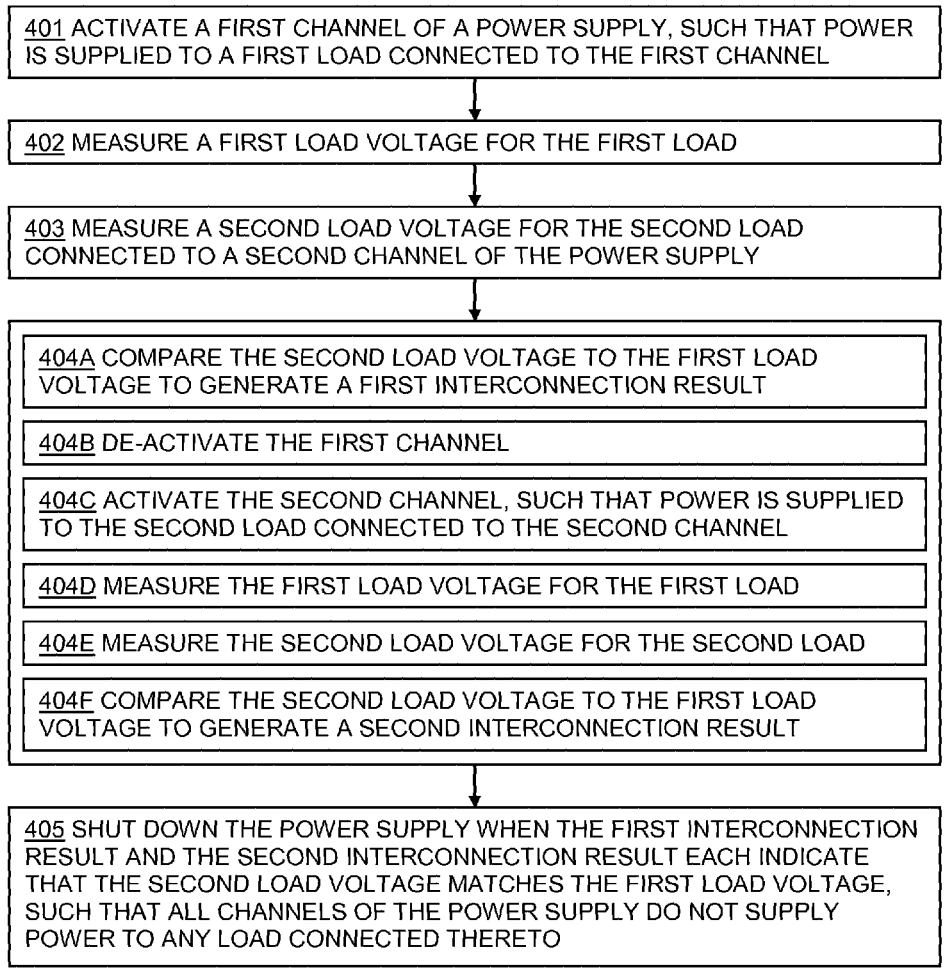

In some embodiments, such as shown in FIG. 4, the IOD first activates one channel, and then another, to detect whether two channels are interconnected. The interconnected output detection process 140-2 activates a first channel of a power supply, step 401, such that power is supplied to a first load connected to the first channel. The IOD measures a first load voltage for the first load, step 402, and measures a second load voltage for a second load connected to a second channel of the power supply, step 403. The IOD compares the second load voltage to the first load voltage to generate a first interconnection result, step 404A. The IOD then de-activates the first channel, step 404B, such that no power is provided via the first channel. The IOD next activates the second channel, step 404C, such that power is supplied to the second load connected to the second channel. The IOD measures the first load voltage for the first load, step 404D. This results in a second measurement of the first load voltage, which may be different from the first measurement taken by the IOD in step 402. The IOD also measures the second load voltage for the second load, step 404E, which also results in a second measurement of the second load voltage. These second measurements of each load voltage are then compared. In other words, the IOD compares the second load voltage to the first load voltage to generate a second interconnection result. If the first channel and the second channel are actually interconnected, then the first interconnection result will indicate that the first load voltage and the second load voltage are the same and/or substantially the same. Turning off the first channel and turning on the second channel should result in the load voltage across the second load again being the same and/or substantially the same as the load voltage across the first load, if the first and second channels truly are interconnected. Thus, the detection of interconnected outputs may be verified. In such embodiments, the IOD shuts down the power supply, step 405, when the first interconnection result and the second interconnection result each indicate that the second load voltage matches the first load voltage, such that all channels of the power supply do not supply power to any load connected thereto.

Figure 5:
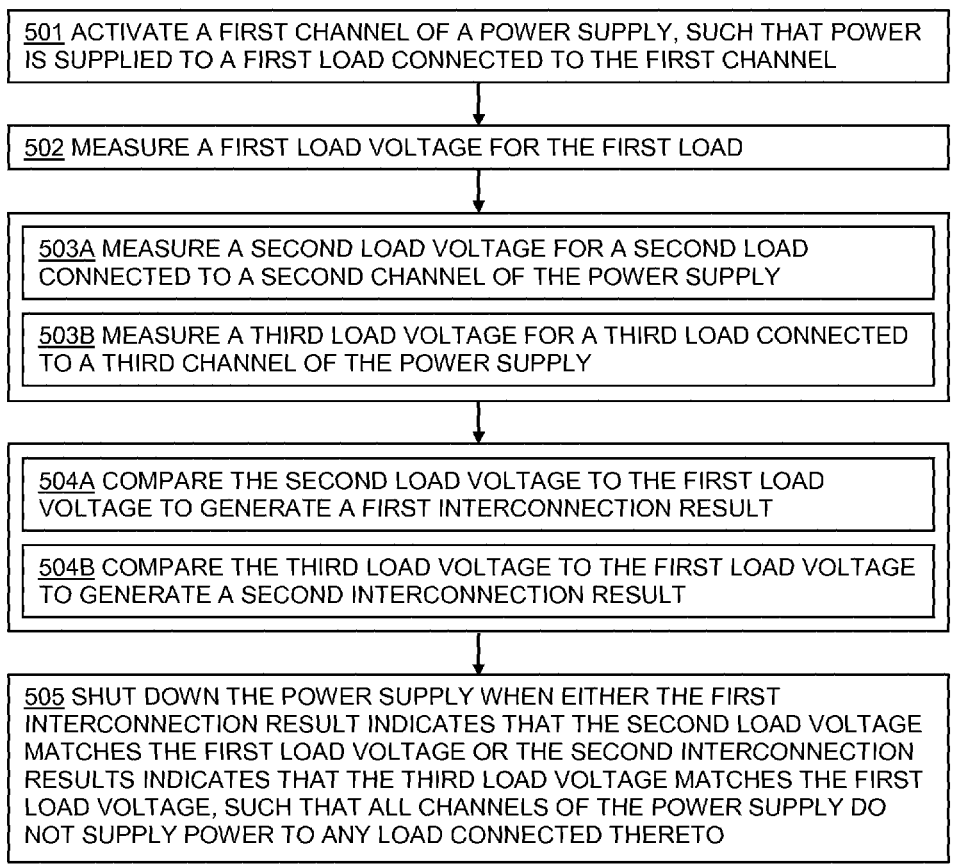

Embodiments are easily extended to any number of output channels of a power supply, as shown in FIG. 5. In FIG. 5, the interconnected output detection process 140-2 activates a first channel of a power supply, step 501, such that power is supplied to a first load connected to the first channel. The IOD measures a first load voltage for the first load, step 502. The IOD also measures a second load voltage for a second load connected to a second channel of the power supply, step 503A, and measures a third load voltage for a third load connected to a third channel of the power supply, step 503B. The IOD compares the second load voltage to the first load voltage to generate a first interconnection result, step 504A, and compares the third load voltage to the first load voltage to generate a second interconnection result, step 504B. The IOD may, and in some embodiments does, perform these measurements and/or comparisons sequentially or simultaneous, as needed. The IOD shuts down the power supply when either the first interconnection result indicates that the second load voltage matches the first load voltage, such that the first output and the second output are interconnected, or the second interconnection results indicates that the third load voltage matches the first load voltage, such that the first output and the third output are interconnected, step 505. Thus, all channels of the power supply do not supply power to any load connected thereto.

Figure 6A:
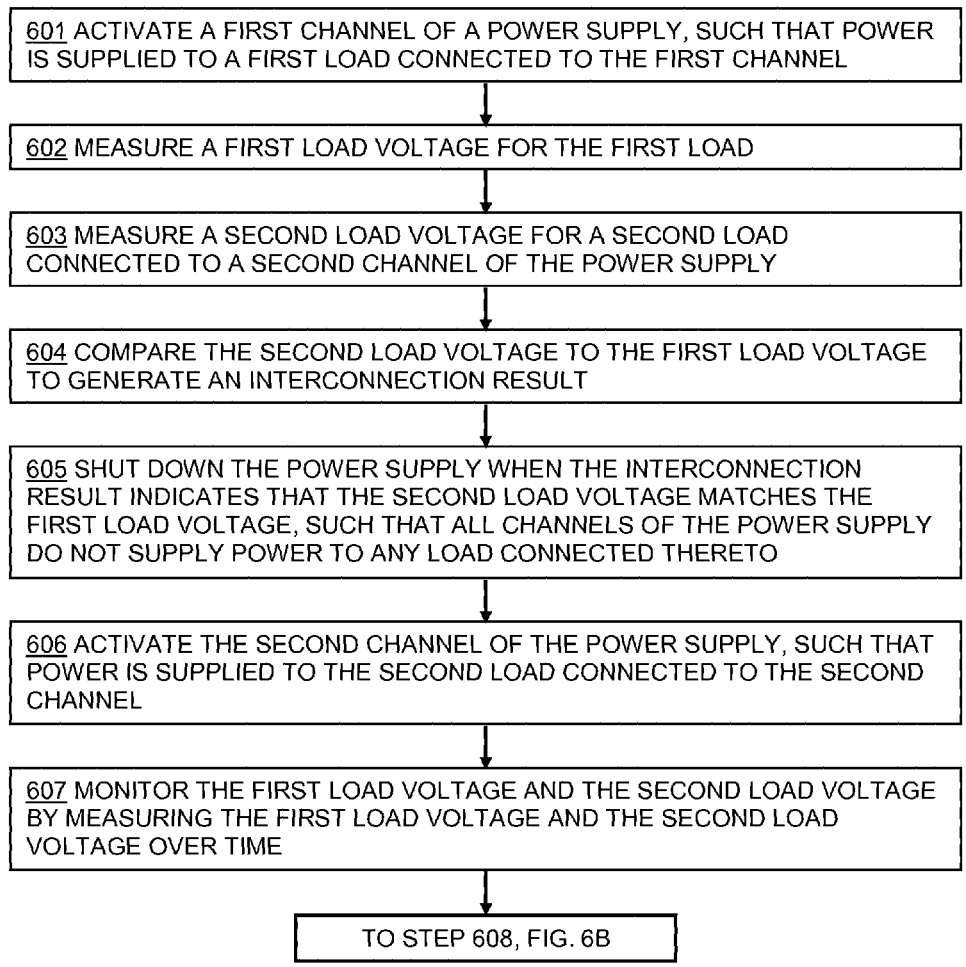
Figure 6B:
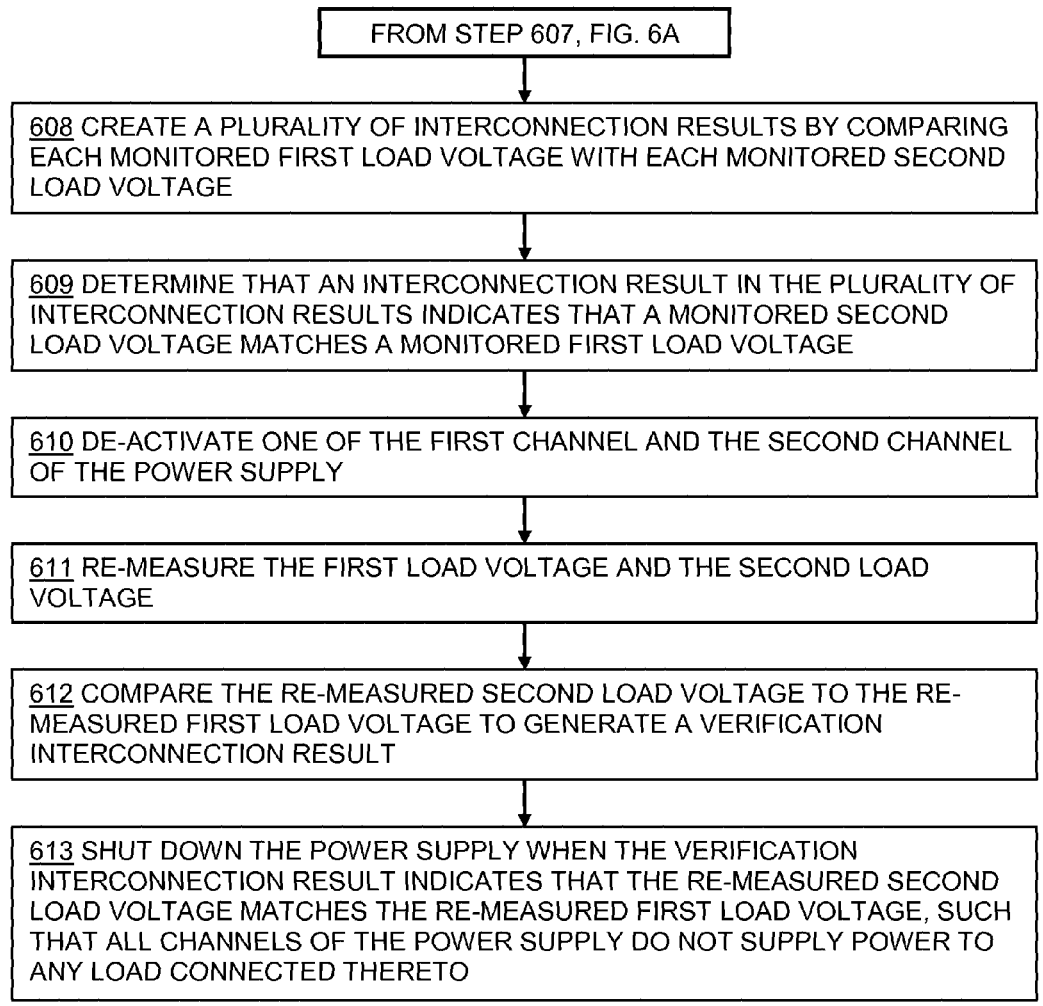

In FIGS. 6A-6B, the IOD, after initially detecting no interconnections between the output channels of a power supply, activates all of the channels. The IOD then monitors the load voltages on the channels to detect an interconnection that occurs later in time. In other words, in FIG. 6A, the interconnected output detection process 140-2 activates a first channel of a power supply, step 601, such that power is supplied to a first load connected to the first channel. The interconnected output detection process 140-2 measures a first load voltage for the first load, step 602. The interconnected output detection process 140-2 measures a second load voltage, step 603, for a second load connected to a second channel of the power supply. The interconnected output detection process 140-2 then compares the second load voltage to the first load voltage to generate an interconnection result, step 604. The OID shuts down the power supply when the interconnection result indicates that the second load voltage matches the first load voltage, step 605, such that all channels of the power supply do not supply power to any load connected thereto.

The IOD activates the second channel of the power supply, step 606, such that power is supplied to the second load connected to the second channel. The IOD monitors the first load voltage and the second load voltage by measuring the first load voltage and the second load voltage over time, step 607. Functionality now passes to step 608, shown in FIG. 6B. In FIG. 6B, the IOD creates a plurality of interconnection results by comparing each monitored first load voltage with each monitored second load voltage, step 608. The IOD determines that an interconnection result in the plurality of interconnection results indicates that a monitored second load voltage matches a monitored first load voltage, step 609. This should indicate that two of the output channels of the power supply have become interconnected. The IOD de-activates one of the first channel and the second channel of the power supply, step 610, and then re-measures the first load voltage and the second load voltage, step 611. The IOD next compares the re-measured second load voltage to the re-measured first load voltage to generate a verification interconnection result, step 612. The IOD shuts down the power supply when the verification interconnection result indicates that the re-measured second load voltage matches the re-measured first load voltage, step 613, such that all channels of the power supply do not supply power to any load connected thereto.

Figure 7A:
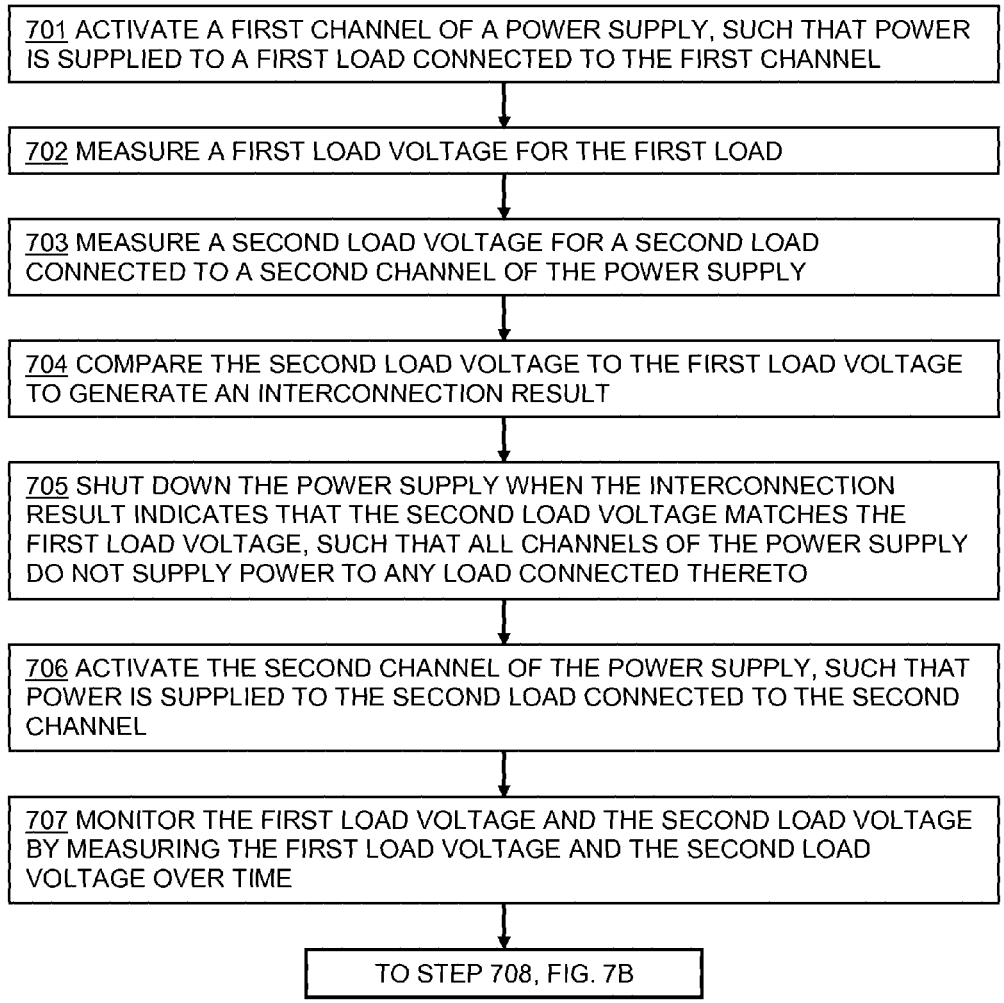
Figure 7B:
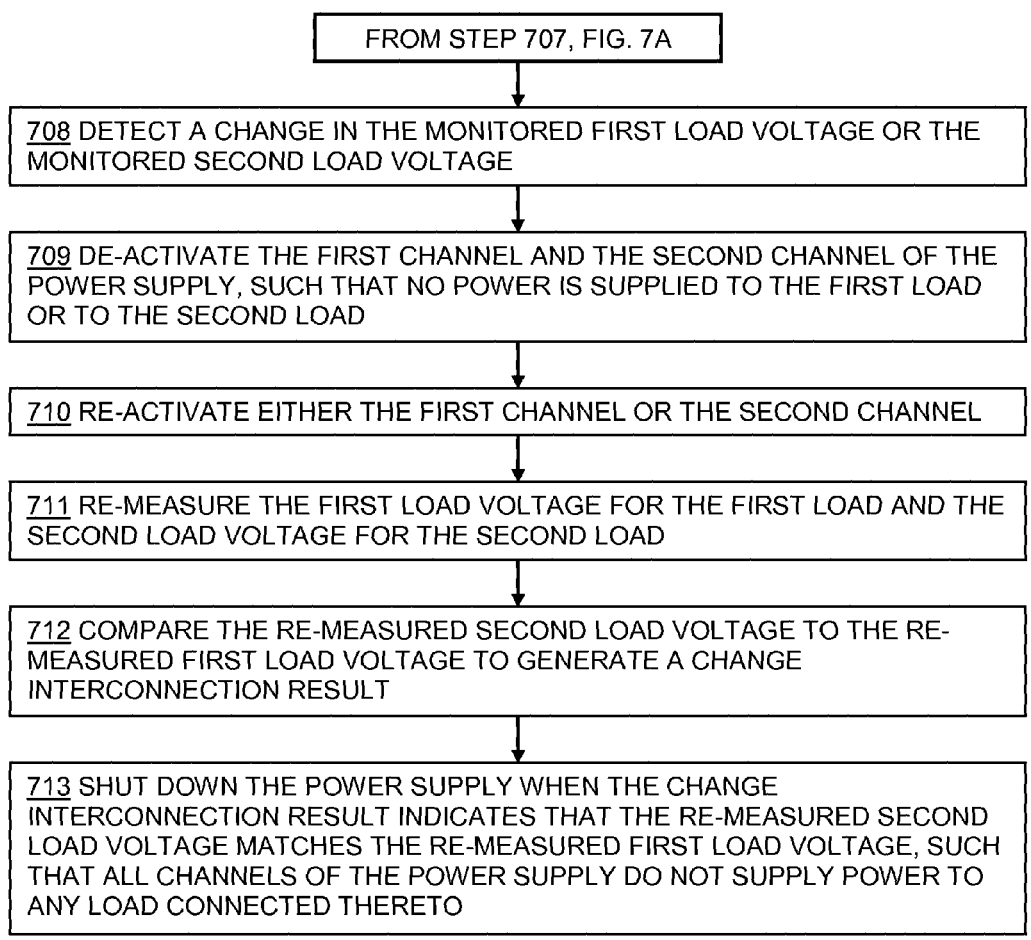

In FIGS. 7A-7B, the IOD detects a change in a monitored load voltage and uses this information to detect interconnected outputs. Thus, in FIG. 7A, the interconnected output detection process 140-2 activates a first channel of a power supply, step 701, such that power is supplied to a first load connected to the first channel. The interconnected output detection process 140-2 measures a first load voltage for the first load, step 702. The interconnected output detection process 140-2 measures a second load voltage, step 703, for a second load connected to a second channel of the power supply. The interconnected output detection process 140-2 then compares the second load voltage to the first load voltage to generate an interconnection result, step 704. The OID shuts down the power supply when the interconnection result indicates that the second load voltage matches the first load voltage, step 705, such that all channels of the power supply do not supply power to any load connected thereto.

The IOD activates the second channel of the power supply, step 706, such that power is supplied to the second load connected to the second channel. The IOD monitors the first load voltage and the second load voltage by measuring the first load voltage and the second load voltage over time, step 707. Functionality now passes to step 708 in FIG. 7B. In FIG. 7B, the IOD detects a change in the monitored first load voltage or the monitored second load voltage, step 708. This may occur at any time during monitoring of the load voltages. The IOD then de-activates the first channel and the second channel of the power supply, step 709, such that no power is supplied to the first load or to the second load. The IOD re-activates either the first channel or the second channel, step 710. The specific channel that the IOD re-activates is, in some embodiments, not relevant, though in some embodiments the IOD is configured to re-activate a certain channel. The IOD then re-measures the first load voltage for the first load and the second load voltage for the second load, step 711. The IOD next compares the re-measured second load voltage to the re-measured first load voltage to generate a change interconnection result, step 712. The IOD uses the change interconnection result to determine if there an interconnection between the outputs, shown by the change in the load voltage. The IOD shuts down the power supply, step 713, when the change interconnection result indicates that the re-measured second load voltage matches the re-measured first load voltage, such that all channels of the power supply do not supply power to any load connected thereto.

Figure 8:
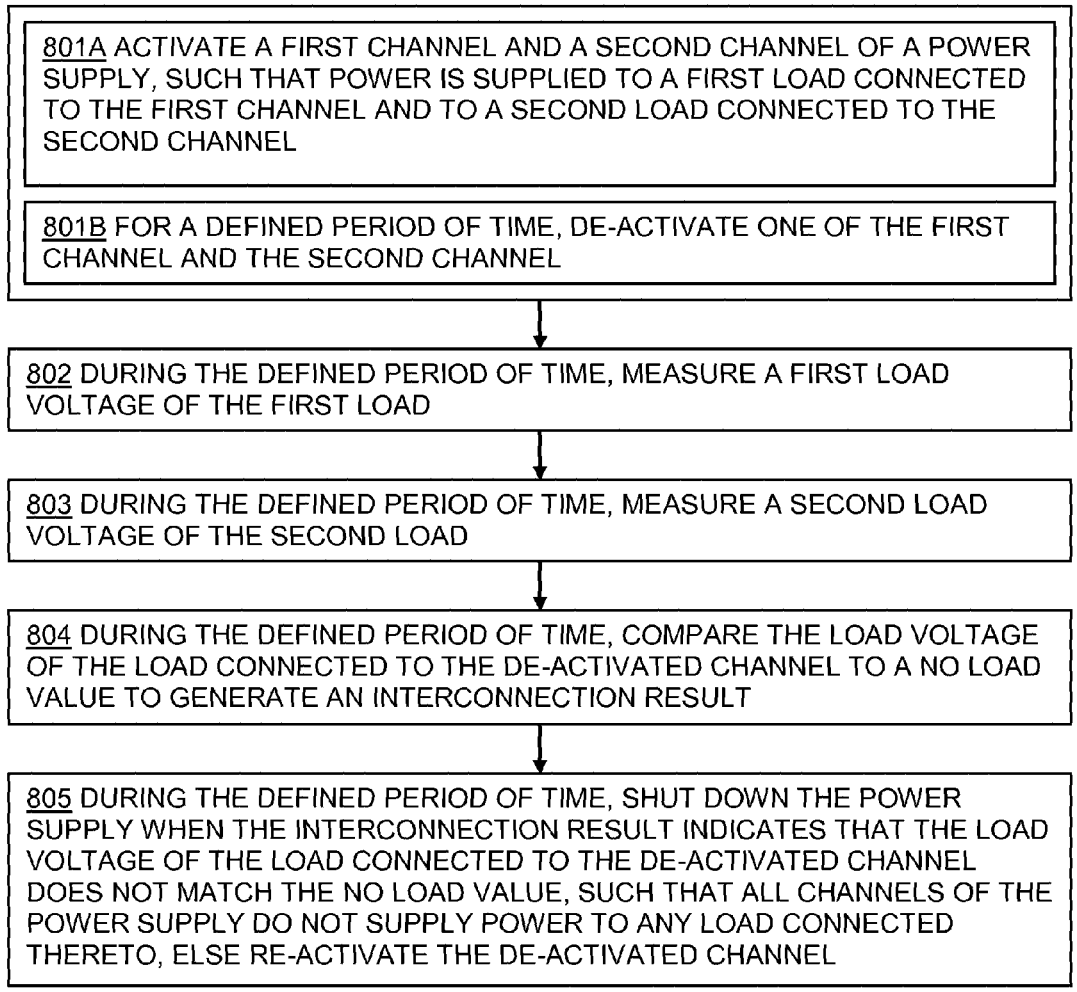

In FIG. 8, the IOD works during operation of the power supply to detect whether outputs are interconnected. This detection is a test that may be, and in some embodiments is, performed at certain intervals of time, whether random, defined, or both. In such embodiments, there may be a minor period of time during which strobing occurs, that is, during which one or more of the loads powered by the power supply rapidly turn on and off. The defined period of time described herein is specifically chosen to minimize any potential strobing effects, and/or to outright eliminate such effects, if possible. The IOD activates a first channel and a second channel of a power supply, such that power is supplied to a first load connected to the first channel and to a second load connected to the second channel, step 801A. Then, for a defined period of time, the IOD de-activates one of the first channel and the second channel, step 801B. The IOD, during the defined period of time, measures a first load voltage of the first load, step 802. The IOD, during the defined period of time, measures a second load voltage of the second load, step 803. The IOD, during the defined period of time, compares the load voltage of the load connected to the de-activated channel to a no load value to generate an interconnection result, step 804. The no load value is stored within memory, such as but not limited to the memory 122 of the power supply 100 shown in FIG. 1. The no load value indicates what the load voltage of that load should be when no power supplied to it. If the measured load voltage matches the no load value, then the outputs are not interconnected, and the de-activated channel should be re-activated. If the measured load voltage does not match the no load value, then the outputs are not interconnected, and the power supply should be shut down. Thus, the IOD, during the defined period of time, shuts down the power supply when the interconnection result indicates that the load voltage of the load connected to the de-activated channel does not match the no load value, such that all channels of the power supply do not supply power to any load connected thereto, else re-activating the de-activated channel, step 805.

The methods and systems described herein are not limited to a particular hardware or software configuration, and may find applicability in many computing or processing environments. The methods and systems may be implemented in hardware or software, or a combination of hardware and software. The methods and systems may be implemented in one or more computer programs, where a computer program may be understood to include one or more processor executable instructions. The computer program(s) may execute on one or more programmable processors, and may be stored on one or more storage medium readable by the processor (including volatile and non-volatile memory and/or storage elements), one or more input devices, and/or one or more output devices. The processor thus may access one or more input devices to obtain input data, and may access one or more output devices to communicate output data. The input and/or output devices may include one or more of the following: Random Access Memory (RAM), Redundant Array of Independent Disks (RAID), floppy drive, CD, DVD, magnetic disk, internal hard drive, external hard drive, memory stick, or other storage device capable of being accessed by a processor as provided herein, where such aforementioned examples are not exhaustive, and are for illustration and not limitation.

The computer program(s) may be implemented using one or more high level procedural or object-oriented programming languages to communicate with a computer system; however, the program(s) may be implemented in assembly or machine language, if desired. The language may be compiled or interpreted.

As provided herein, the processor(s) may thus be embedded in one or more devices that may be operated independently or together in a networked environment, where the network may include, for example, a Local Area Network (LAN), wide area network (WAN), and/or may include an intranet and/or the internet and/or another network. The network(s) may be wired or wireless or a combination thereof and may use one or more communications protocols to facilitate communications between the different processors. The processors may be configured for distributed processing and may utilize, in some embodiments, a client-server model as needed. Accordingly, the methods and systems may utilize multiple processors and/or processor devices, and the processor instructions may be divided amongst such single- or multiple-processor/devices.

The device(s) or computer systems that integrate with the processor(s) may include, for example, a personal computer(s), workstation(s) (e.g., Sun, HP), personal digital assistant(s) (PDA(s)), handheld device(s) such as cellular telephone(s) or smart cellphone(s), laptop(s), handheld computer(s), or another device(s) capable of being integrated with a processor(s) that may operate as provided herein. Accordingly, the devices provided herein are not exhaustive and are provided for illustration and not limitation.

References to "a microprocessor" and "a processor", or "microprocessor" and "the processor," may be understood to include one or more microprocessors that may communicate in a stand-alone and/or a distributed environment(s), and may thus be configured to communicate via wired or wireless communications with other processors, where such one or more processor may be configured to operate on one or more processor-controlled devices that may be similar or different devices. Use of such "microprocessor" or "processor" terminology may thus also be understood to include a central processing unit, an arithmetic logic unit, an application-specific integrated circuit (IC), and/or a task engine, with such examples provided for illustration and not limitation.

Furthermore, references to memory, unless otherwise specified, may include one or more processor-readable and accessible memory elements and/or components that may be internal to the processor-controlled device, external to the processor-controlled device, and/or may be accessed via a wired or wireless network using a variety of communications protocols, and unless otherwise specified, may be arranged to include a combination of external and internal memory devices, where such memory may be contiguous and/or partitioned based on the application. Accordingly, references to a database may be understood to include one or more memory associations, where such references may include commercially available database products (e.g., SQL, Informix, Oracle) and also proprietary databases, and may also include other structures for associating memory such as links, queues, graphs, trees, with such structures provided for illustration and not limitation.

References to a network, unless provided otherwise, may include one or more intranets and/or the internet. References herein to microprocessor instructions or microprocessor-executable instructions, in accordance with the above, may be understood to include programmable hardware.

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems.

Throughout the entirety of the present disclosure, use of the articles "a" and/or "an" and/or "the" to modify a noun may be understood to be used for convenience and to include one, or more than one, of the modified noun, unless otherwise specifically stated. The terms "comprising", "including" and "having" are intended to be inclusive and mean that there may be additional elements other than the listed elements.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Although the methods and systems have been described relative to a specific embodiment thereof, they are not so limited. Obviously many modifications and variations may become apparent in light of the above teachings. Many additional changes in the details, materials, and arrangement of parts, herein described and illustrated, may be made by those skilled in the art.

What is claimed is:

1. A method comprising:
    activating a first channel of a power supply, such that power is supplied to a first load connected to the first channel;
    measuring a first load voltage for the first load;
    measuring a second load voltage for a second load connected to a second channel of the power supply;
    comparing the second load voltage to the first load voltage to generate an interconnection result; and
    shutting down the power supply when the interconnection result indicates that the second load voltage matches the first load voltage, such that all channels of the power supply do not supply power to any load connected thereto.

2. The method of claim 1, further comprising:
prior to activating the first channel:
measuring a first baseline voltage for the first load;
measuring a second baseline voltage for the second load; and
after activating the first channel:
wherein comparing comprises:
comparing the second load voltage to the second baseline voltage to generate a baseline interconnection result; and
wherein shutting down comprises:
shutting down the power supply when the baseline interconnection result indicates that the second load voltage is different from the second baseline voltage, such that all channels of the power supply do not supply power to any load connected thereto.

3. The method of claim 2, wherein comparing further comprises:
comparing the second load voltage to the first load voltage to generate an interconnection result;
and wherein shutting down the power supply comprises:
shutting down the power supply when the interconnection result indicates that the second load voltage matches the first load voltage and when the baseline interconnection result indicates that the second load voltage is different from the second baseline voltage, such that all channels of the power supply do not supply power to any load connected thereto.

4. The method of claim 1, wherein comparing comprises:
comparing the second load voltage to the first load voltage to generate a first interconnection result;
de-activating the first channel;
activating the second channel, such that power is supplied to the second load connected to the second channel;
measuring the first load voltage for the first load;
measuring the second load voltage for the second load; and
comparing the second load voltage to the first load voltage to generate a second interconnection result; and
wherein shutting down comprises:
shutting down the power supply when the first interconnection result and the second interconnection result each indicate that the second load voltage matches the first load voltage, such that all channels of the power supply do not supply power to any load connected thereto.

5. The method of claim 1, wherein measuring a second load voltage comprises:
measuring a second load voltage for a second load connected to a second channel of the power supply; and
measuring a third load voltage for a third load connected to a third channel of the power supply;
wherein comparing comprises:
comparing the second load voltage to the first load voltage to generate a first interconnection result; and
comparing the third load voltage to the first load voltage to generate a second interconnection result; and
wherein shutting down comprises:
shutting down the power supply when either the first interconnection result indicates that the second load voltage matches the first load voltage or the second interconnection results indicates that the third load voltage matches the first load voltage, such that all channels of the power supply do not supply power to any load connected thereto.

6. The method of claim 1, further comprising:
activating the second channel of the power supply, such that power is supplied to the second load connected to the second channel;
monitoring the first load voltage and the second load voltage by measuring the first load voltage and the second load voltage over time;
creating a plurality of interconnection results by comparing each monitored first load voltage with each monitored second load voltage;
determining that an interconnection result in the plurality of interconnection results indicates that a monitored second load voltage matches a monitored first load voltage;
de-activating one of the first channel and the second channel of the power supply;
re-measuring the first load voltage and the second load voltage;
comparing the re-measured second load voltage to the re-measured first load voltage to generate a verification interconnection result; and
shutting down the power supply when the verification interconnection result indicates that the re-measured second load voltage matches the re-measured first load voltage, such that all channels of the power supply do not supply power to any load connected thereto.

7. The method of claim 1, further comprising:
activating the second channel of the power supply, such that power is supplied to the second load connected to the second channel;
monitoring the first load voltage and the second load voltage by measuring the first load voltage and the second load voltage over time;
detecting a change in the monitored first load voltage or the monitored second load voltage;
de-activating the first channel and the second channel of the power supply, such that no power is supplied to the first load or to the second load;
re-activating either the first channel or the second channel;
re-measuring the first load voltage for the first load and the second load voltage for the second load;
comparing the re-measured second load voltage to the re-measured first load voltage to generate a change interconnection result; and
shutting down the power supply when the change interconnection result indicates that the re-measured second load voltage matches the re-measured first load voltage, such that all channels of the power supply do not supply power to any load connected thereto.

8. The method of claim 1, wherein activating comprises:
activating a first channel and a second channel of a power supply, such that power is supplied to a first load connected to the first channel and to a second load connected to the second channel; and
for a defined period of time, de-activating one of the first channel and the second channel;
wherein measuring a first load voltage comprises:
during the defined period of time, measuring a first load voltage of the first load;
wherein measuring a second load voltage comprises:
during the defined period of time, measuring a second load voltage of the second load;

wherein comparing comprises:
during the defined period of time, comparing the load voltage of the load connected to the de-activated channel to a no load value to generate an interconnection result; and wherein shutting down comprises:
during the defined period of time, shutting down the power supply when the interconnection result indicates that the load voltage of the load connected to the de-activated channel does not match the no load value, such that all channels of the power supply do not supply power to any load connected thereto, else re-activating the de-activated channel.

9. A power supply comprising:
an input circuit configured to receive input power and to provide modified input power; and
an output circuit configured to receive the modified input power and to output output power, wherein the output circuit comprises:
a first channel;
a second channel;
a processor;
a memory; and
an interconnection mechanism allowing communication between the processor, the memory, the first channel, and the second channel;
wherein the first channel and the second channel provide the output power to one or more loads connected thereto; and
wherein the memory is encoded with an interconnected output detection application, which, when executed in the processor as an interconnected output detection process, causes the output circuit to perform operations of:
activating the first channel, such that power is supplied to a first load connected to the first channel;
measuring a first load voltage for the first load;
measuring a second load voltage for a second load connected to the second channel;
comparing the second load voltage to the first load voltage to generate an interconnection result; and
shutting down the power supply when the interconnection result indicates that the second load voltage matches the first load voltage, such that all channels of the power supply do not supply power to any load connected thereto.

10. The power supply of claim 9, wherein the output circuit performs further operations of:
prior to activating the first channel:
measuring a first baseline voltage for the first load;
measuring a second baseline voltage for the second load; and
after activating the first channel:
wherein comparing comprises:
comparing the second load voltage to the second baseline voltage to generate a baseline interconnection result; and
wherein shutting down comprises:
shutting down the power supply when the baseline interconnection result indicates that the second load voltage is different from the second baseline voltage, such that all channels of the power supply do not supply power to any load connected thereto.

11. The power supply of claim 10, wherein when comparing, the output circuit performs further operations of:
comparing the second load voltage to the first load voltage to generate an interconnection result;
and wherein when shutting down the power supply, the output circuit performs operations of:
shutting down the power supply when the interconnection result indicates that the second load voltage matches the first load voltage and when the baseline interconnection result indicates that the second load voltage is different from the second baseline voltage, such that all channels of the power supply do not supply power to any load connected thereto.

12. The power supply of claim 9, wherein when comparing, the output circuit performs operations of:
comparing the second load voltage to the first load voltage to generate a first interconnection result;
de-activating the first channel;
activating the second channel, such that power is supplied to the second load connected to the second channel;
measuring the first load voltage for the first load;
measuring the second load voltage for the second load; and
comparing the second load voltage to the first load voltage to generate a second interconnection result; and
wherein when shutting down, the output circuit performs operations of:
shutting down the power supply when the first interconnection result and the second interconnection result each indicate that the second load voltage matches the first load voltage, such that all channels of the power supply do not supply power to any load connected thereto.

13. The power supply of claim 9, wherein when measuring a second load voltage, the output circuit performs operations of:
measuring a second load voltage for a second load connected to a second channel of the power supply; and
measuring a third load voltage for a third load connected to a third channel of the power supply;
wherein when comparing, the output circuit performs operations of:
comparing the second load voltage to the first load voltage to generate a first interconnection result; and
comparing the third load voltage to the first load voltage to generate a second interconnection result; and
wherein when shutting down, the output circuit performs operations of:
shutting down the power supply when either the first interconnection result indicates that the second load voltage matches the first load voltage or the second interconnection results indicates that the third load voltage matches the first load voltage, such that all channels of the power supply do not supply power to any load connected thereto.

14. The power supply of claim 9, wherein the output circuit performs further operations of:
activating the second channel of the power supply, such that power is supplied to the second load connected to the second channel;
monitoring the first load voltage and the second load voltage by measuring the first load voltage and the second load voltage over time;
creating a plurality of interconnection results by comparing each monitored first load voltage with each monitored second load voltage;

determining that an interconnection result in the plurality of interconnection results indicates that a monitored second load voltage matches a monitored first load voltage;
de-activating one of the first channel and the second channel of the power supply;
re-measuring the first load voltage and the second load voltage;
comparing the re-measured second load voltage to the re-measured first load voltage to generate a verification interconnection result; and
shutting down the power supply when the verification interconnection result indicates that the re-measured second load voltage matches the re-measured first load voltage, such that all channels of the power supply do not supply power to any load connected thereto.

15. The power supply of claim 9, wherein the output circuit performs further operations of:
activating the second channel of the power supply, such that power is supplied to the second load connected to the second channel;
monitoring the first load voltage and the second load voltage by measuring the first load voltage and the second load voltage over time;
detecting a change in the monitored first load voltage or the monitored second load voltage;
de-activating the first channel and the second channel of the power supply, such that no power is supplied to the first load or to the second load;
re-activating either the first channel or the second channel;
re-measuring the first load voltage for the first load and the second load voltage for the second load;
comparing the re-measured second load voltage to the re-measured first load voltage to generate a change interconnection result; and
shutting down the power supply when the change interconnection result indicates that the re-measured second load voltage matches the re-measured first load voltage, such that all channels of the power supply do not supply power to any load connected thereto.

16. The power supply of claim 9, wherein when activating, the output circuit performs operations of:
activating a first channel and a second channel of a power supply, such that power is supplied to a first load connected to the first channel and to a second load connected to the second channel; and
for a defined period of time, de-activating one of the first channel and the second channel;
wherein when measuring a first load voltage, the output circuit performs operations of:
during the defined period of time, measuring a first load voltage of the first load;
wherein when measuring a second load voltage, the output circuit performs operations of:
during the defined period of time, measuring a second load voltage of the second load;
wherein when comparing, the output circuit performs operations of:
during the defined period of time, comparing the load voltage of the load connected to the de-activated channel to a no load value to generate an interconnection result; and
wherein when shutting down, the output circuit performs operations of:
during the defined period of time, shutting down the power supply when the interconnection result indicates that the load voltage of the load connected to the de-activated channel does not match the no load value, such that all channels of the power supply do not supply power to any load connected thereto, else re-activating the de-activated channel.

17. A computer program product, stored on a non-transitory computer readable medium, including instructions that, when executed on a processor in communication with a power supply, cause the processor to perform operations of:
activating a first channel of a power supply, such that power is supplied to a first load connected to the first channel;
measuring a first load voltage for the first load;
measuring a second load voltage for a second load connected to a second channel of the power supply;
comparing the second load voltage to the first load voltage to generate an interconnection result; and
shutting down the power supply when the interconnection result indicates that the second load voltage matches the first load voltage, such that all channels of the power supply do not supply power to any load connected thereto.

* * * * *